United States Patent [19]
Khoury

[11] Patent Number: 5,931,898
[45] Date of Patent: Aug. 3, 1999

[54] FINITE IMPULSE RESPONSE FILTER

[76] Inventor: John M. Khoury, 36 Jane St., New Providence, N.J. 07974

[21] Appl. No.: 08/805,946

[22] Filed: Feb. 25, 1997

[51] Int. Cl.$^6$ ................................ G06G 7/02; G06J 1/00
[52] U.S. Cl. ................................................ 708/819; 708/3
[58] Field of Search ...................................... 364/602, 825

[56] References Cited

U.S. PATENT DOCUMENTS 5,563,819 10/1996 Nelson ..................................... 364/825

OTHER PUBLICATIONS

Y. Haque and M. Copeland "Distortion in Rotating Tap Weight Transversal Filters" Jun. 1979 IEEE Journal of Solidstate Circuits vol. SC–14 #3 pp. 627–633.

J.B. Hughes N.C. Bird I.C. Mac Beth "Switched Currents—A New Technique for Analog Sampled–Data Signal Processing" ISCAS '89 pp. 1584–1587.

*Primary Examiner*—Tan V. Mai

[57] ABSTRACT

A finite impulse response filter uses rotating tap weights that are connected in turn to a succession of sample/hold (S/H) cells in each of which is held a separate successive sample of an analog balanced signal being filtered for an interval long enough to tap to each tap weight in one rotation. Each of the S/H cells is a switched-current memory cell and includes a primary negative feedback transconductance differential amplifier and a primary pair of storage capacitors and a secondary positive feedback transconductance differential amplifier and a secondary pair of storage capacitors. Charge injection errors created in each primary amplifier are replicated in an associated secondary amplifier and used to cancel these errors to provide higher fidelity samples for summing for forming the output of the filter.

The tap weights are provided by binary-ratioed resistors provided by transistors of binary-ratioed transconductances.

5 Claims, 6 Drawing Sheets

FINITE IMPULSE RESPONSE FILTER

FIELD OF THE INVENTION

This invention relates to an electronic transversal filter and more particularly that of the kind generally described as a Finite Impulse Response filter.

BACKGROUND OF THE INVENTION

Finite Impulse Response (FIR) filters have widespread use in digital communication channels requiring adaptive equalization. Applications include telecommunication systems such as Asynchronous Transfer Mode (ATM) networks and Partial Response Maximum Likelihood (PRML) read channels found in hard disk drive systems.

The early forms of such filters were generally implemented with a shift register delay line that was supplied with an input analog signal and that was provided with a plurality of taps from which there could be derived samples of the analog signal. These samples were appropriately weighted in accordance with the desired filter response and then summed to provide the desired output.

A significant disadvantage of this approach is that as the input analog sample is shifted along the register from tap to tap, errors accumulate and there tends to be substantial degradation.

To meet this problem, a solution was developed that involved storing successive analog samples only once in successive sample and hold (S/H) cells and using a rotating switch matrix to interconnect the successive S/H cells to different tap weights to simulate the shifting action of a shift register delay line. Rotating the tap weights from each S/H cell to the next requires a switch matrix that can connect every tap to every S/H cell. As the number of taps is increased to accommodate longer-duration filter impulse responses, considerable capacitance is provided at the output of each S/H cell, and this limits the maximum sampling rate that can be effectively utilized. To overcome this limitation on the sampling rate, there was proposed a solution that involved eliminating the rotating switch matrix and digitally rotating the tap weights associated with the successive S/H cells. The tap weights were implemented as Multiplying Digital to Analog Converters (MDACs), with their gain programmed by the digital tap weight stored in a shift register. Such a solution is described in a paper entitled "Design and Characterization of a Real-Time Correlator," published in the IEEE Journal of Solid-State Circuits, Vol. SC-12#6, December 1977, pp. 642–649 and "Distortion in Rotating Tap Weight Transversal Filters," published in the IEEE Journal of Solid-State Circuits, Vol. SC-14#3, June 1979, pp. 627–633, by Y. A. Hague and M. A. Copeland. The key to such described S/H and MDAC approach lies in the use of voltage, as the signal that is stored and summed, as opposed to charge, the approach that characterized previous designs. To this end, the desired tap weight is implemented with binary area-ratioed capacitors and the desired summed output is the weighted summation of the stored voltages.

However, this approach when used with a large number of weights tends to involve a substantial current drain to operate at high sample rates and so may not be readily amenable to use with low-power high-density circuits, currently characteristic of microelectronic apparatus.

SUMMARY OF THE INVENTION

The present invention seeks to remedy this shortcoming by an adaptive FIR filter in which the signal processing that provides the filtering is done in the current domain and the samples that are summed are analog current samples.

In particular, the input signal to be filtered is sampled to provide analog samples of current that are stored in an array of S/H circuits, preferably of the balanced or differential type. Each S/H circuit has three modes of operation. It samples the input current during one clock step, it makes a transition into the hold mode during the next clock step, and it maintains this mode during which the S/H supplies the held value to a weighting circuit for as many clock steps as there are taps in the filter for providing a scaled output current to a summing circuit for summation with other scaled output currents to provide the filter output.

For example, an N tap filter would include (N+2) S/H cells and an (N+2) phase clock generator that selects in turn each S/H cell for the sampling mode by activating appropriate switches to direct the input current selectively to the S/H cell selected for sampling. For scaling, there are also (N+2) weighting circuits, the weights of each being digitally programmable thereby provide the desired filter transfer characteristic. At each clock phase, N such circuits are connected to the S/H cells whose outputs are being scaled and summed. The weights of the (N+2) weighting circuits are shifted in synchronism with the phases of the clock so that each of the (N+2) S/H cells is connected in turn to a weighting circuit with each of the (N+2) adjustable weights.

In accordance with one embodiment of the invention, the input signal needs to be an analog continuous-time current that is sampled successively by an array of balanced current copier circuits that may be of known form and that serve as S/H circuits under control of non-overlapping clock phases provided by a clock generator. Analog samples are never resampled, to avoid the accumulation of errors. The separate samples are scaled individually by weight circuit (i.e., MDACS) typically provided by arrays of binary-ratioed transistors that serve as resistors. At every clock phase each MDAC is reprogrammed with a new tap weight coefficient that is stored digitally in a recirculating memory (i.e., barrel shift register). After scaling, the samples are summed in the current domain by the outputs of the set of N active weight circuits. The value of the weights assigned to each S/H circuit changes every clock step to implement a new scaling coefficient. Advantageously, the MDAC weights are designed to have the same driving point admittance for all programmed coefficient values so that each S/H output always sees the same load value. As a result, the voltage at the output terminals of the S/H circuits need not change once the S/H transitions into the hold mode. This makes possible increased speed of the sampling. This load value ideally is much lower in impedance than the output impedance of the S/H in hold mode, which ideally looks like a current source. In practice, the S/H output impedance is dominated by large amounts of parasitic capacitance, $C_P$ and $C_N$, between the balanced output leads and ground. To maximize the FIR sample rate, the voltages across these two capacitances should not change, as the MDAC is reprogrammed each clock phase to implement the different weights connected to a S/H circuit.

Each weight circuit has two additional functions when not serving provide an output in the summing of the output current of the filter. First, it needs to provide an open circuit to the S/H circuit when the latter is in the sampling mode. Second, it needs to provide an appropriate admittance to the S/H cell during a transition mode interval immediately following the sampling period while simultaneously blocking the transmission of current to the output of the filter. This transition mode interval is used by the S/H cell to settle the voltage on the parasitic capacitors $C_P$ and $C_N$ at the output of the S/H cell The weights advantageously are implemented functionally as resistors by a switch array of binary-ratioed transistors in accordance with a particular feature of the illustrative embodiment. The binary-ratioed resistors are implemented by simple scaling of the channel widths of the transistors so that their conductances are correspondingly scaled.

The basic architectural aspect of the invention makes possible realization of a number of advantages. In particular, the architecture of the illustrative embodiment is designed to maximize the speed of operation with use of the simplest digital CMOS technology available, consistent with maintaining the area and power advantages of an analog implementation of the sampling and weighting functions. However, since the weights are set digitally, they maintain stability without refreshing better than would be the case with analog controlled weights. In effect, the architecture described that makes mixed use of analog and digital values in the weighting process serves to provide advantages over an architecture that is purely digital or purely analog.

A separate circuit aspect of the invention is a novel switched current memory cell for use as a balanced current copier S/H circuit that employs, in addition to a primary differential transconductance amplifier and a pair of primary storage capacitors, a smaller secondary transconductance differential amplifier and smaller secondary storage capacitors. These latter replicate error voltages that result from unwanted switch charge injection, and subtract the resulting error current from the current stored with the main transconductance amplifier to make available truer sample currents for summing.

The invention will be better understood from the following more detailed description taken with the accompanying drawing.

DETAILED DESCRIPTION

Figure 1:
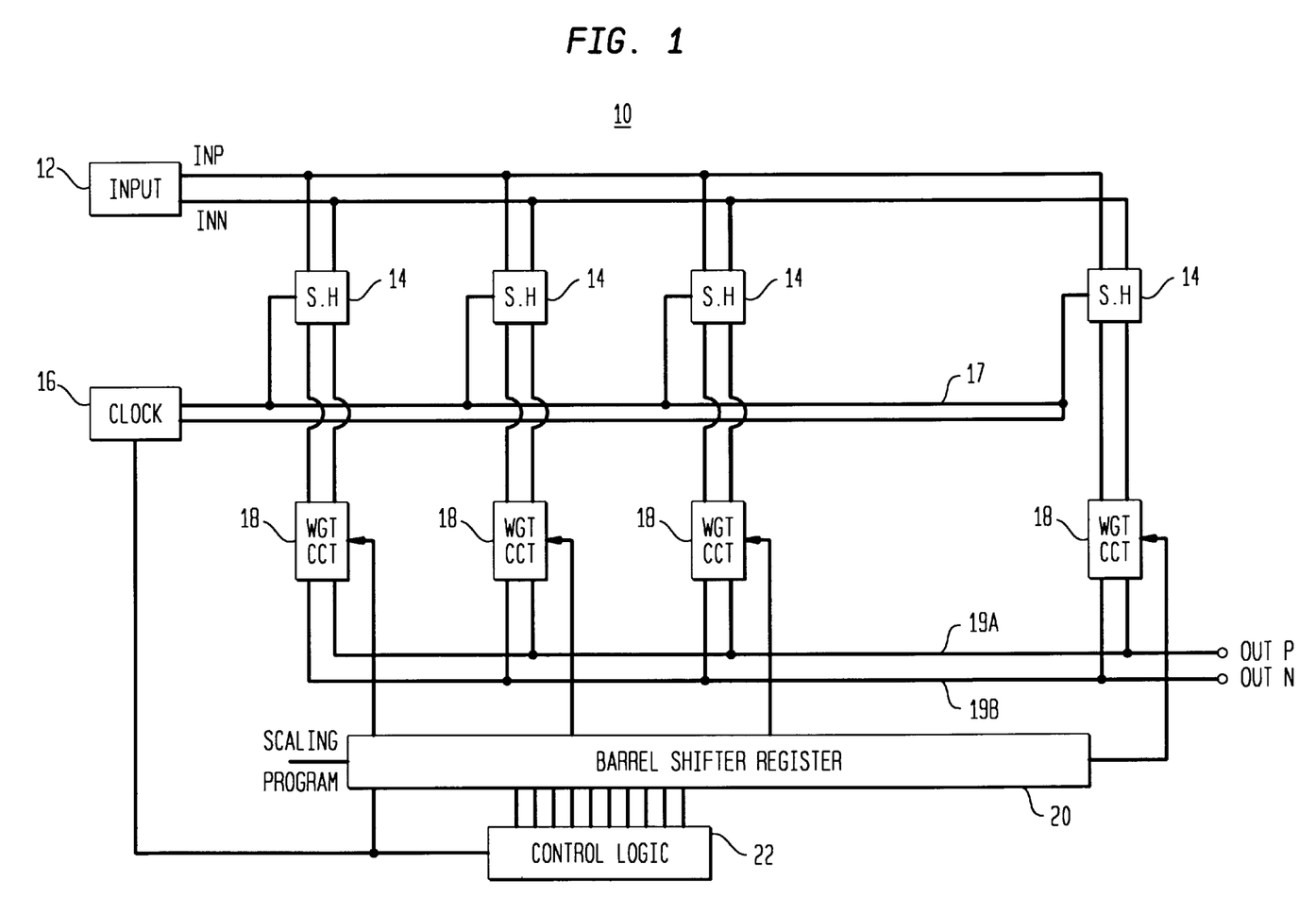
FIG. 1 shows the basic architecture of an illustrative embodiment of this aspect of the invention in block schematic form.

With reference to the drawing, FIG. 1 shows the basic architecture of an FIR filter 10 that is illustrative embodiment of the architectural aspect of the invention. The input analog balanced signal, consisting of currents INN and INP provided by the input balanced source 12, is sampled in turn by each of a plurality of S/H circuits 14. Each of these advantageously is a switched-current memory cell, that is implemented with a transconductance amplifier $G_M$ and MOS capacitors, as shown functionally in FIG. 2 and schematically in FIG. 4, and that will be more fully described below.

The operation of the sampling is controlled by a multiphase clock generator 16 of non-overlapping phases, cooperating with various switches to be described in known fashion, to copy successive samples of the analog input for storage in the successive S/H cells. The bus 17 serves to provide appropriate clock phases to the S/H cells 14.

In the illustrative embodiment, which is a ten tap FIR filter, ten different weighted balance-current samples are summed to provide the balanced current output. To this end, the filter comprises twelve switched-current S/H cells. As previously mentioned, each S/H cell has three modes of operation. In a first clock phase, it samples the input balanced signal. In the next clock phase, it goes into the hold mode, and in the next ten clock phases, the sample value is held available for weighting and summation at the filter output.

Associated with the S/H cells, programmable weight circuits 18 scale the currents stored in each cell and at any given time direct the scaled currents of the ten S/H circuits that are in the held mode and connected to the ten tap circuits selected for supply to a balanced output line 19A, 19B for signal summation.

Since the weight of each tap circuit is to be reprogrammable at every clock phase, a 12-stage recirculating barrel shift register 20 that controls the scaling of the weight circuits rotates the weight coefficients by one position with each clock phase and so dynamically changes the weights. Once every full rotation of the shift register, every $12/f_s$ seconds, where f is the rotation frequency, the barrel shift register is synchronously parallel-loaded with the ten coefficient values that were stored in the program static registers. These values determine the transfer characteristic to be provided by the filter. A control logic circuit 22 provides a serial interface with ten static registers to load the barrel shift register with the ten coefficients needed for the ten tap weight circuits coupled to the ten S/H cells that are then in the third or held mode. These ten values are stepped along for the twelve clock phases of one rotation to affect in turn each of the twelve weight circuits.

Figure 2:
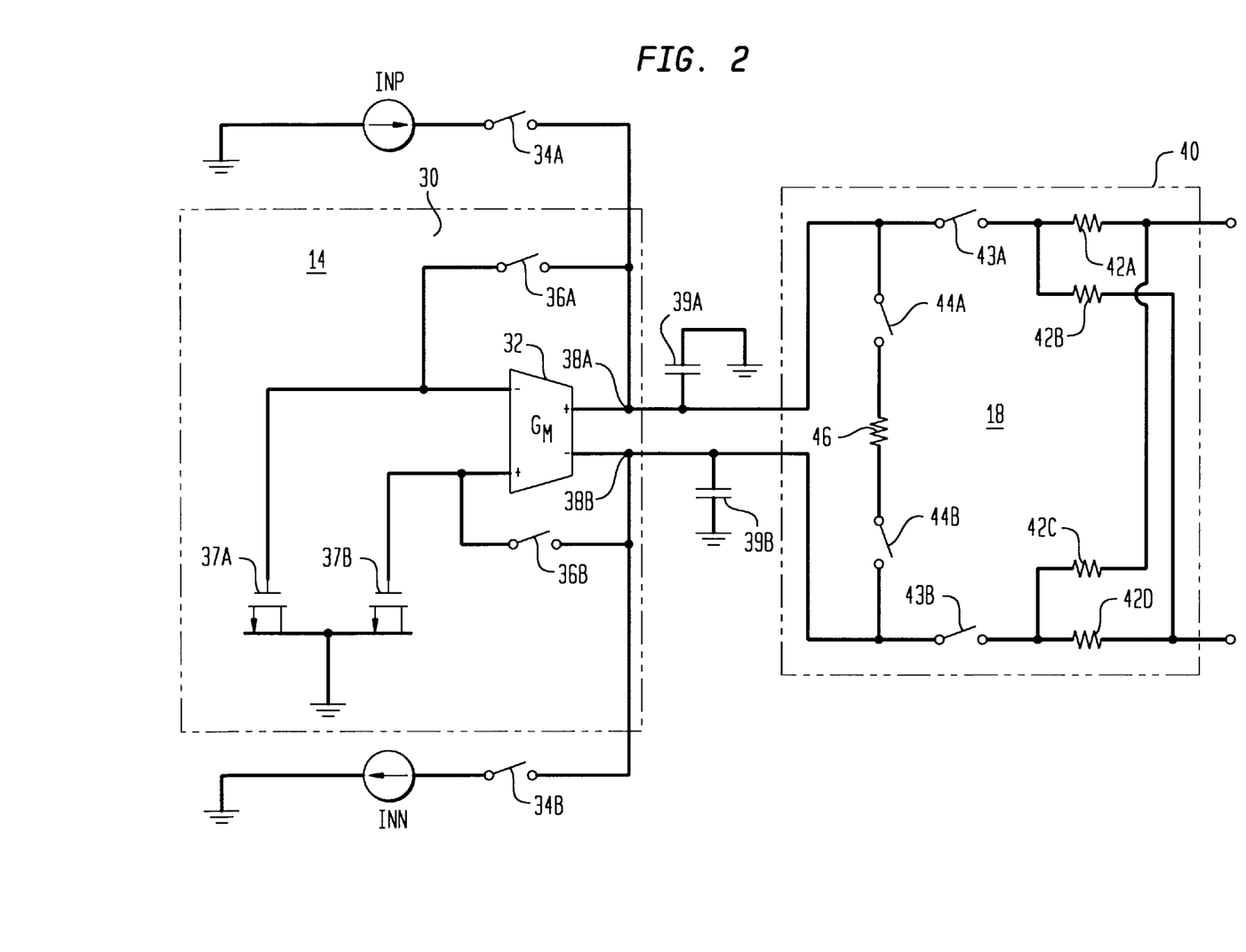
FIG. 2 shows in a simplified functional form a S/H circuit coupled to a weighting circuit suitable for incorporation in the illustrative embodiment.

In FIG. 2, there is shown functionally a S/H cell 14, enclosed within the broken line block 30, coupled to a weight circuit 18, enclosed within the broken line block 40. A preferred form of weight circuit is depicted functionally in FIG. 2 by an array of four cross-connected binary-ratioed resistances 42A–42D and associated switches 43A, 43B and 44A, 44B. The weight circuit essentially serves to produce a balanced current at its output terminals that is its input sample balanced current scaled by the resistance of the applied weight circuit. This multiplying circuit is typically described as a Multiplying Digital to Analog Converter (MDAC). The resistive weight supplied to each MDAC is reprogrammed every clock pulse with the next resistive weight to achieve the desired rotating effect by a barrel shift register, as previously described with reference to FIG. 1. In one complete rotation of the barrel shifter, each MDAC circuit will assume in turn each of the twelve programmed weights, although only ten will be tapped for summing to the FIR output in a given clock phase interval.

For summing, the outputs of the MDACs associated with the ten active weight circuits are supplied during each clock phase as balanced currents to the balanced output line 19A, 19B terminated in a low impedance, e.g., fifty ohms, as a summing circuit to combine the ten balanced currents into the desired filter output, for further utilization in accordance with the desired application.

Returning now to the S/H cell 14 of FIG. 2, it comprises a transconductance differential amplifier 32 that, in the sampling mode corresponding to switches 34A, 34B and 36A, 36B being clocked closed, is supplied by way of input/output terminals 38A, 38B with the inputs INN and INP of the input source. During the sampling mode, the MDAC 18 is disconnected from the S/H cell by the clocked opening of switches 43A, 43B and switches 44A and 44B. The differential current INN, INP flows into the amplifier 32 and into MOS storage capacitors 37A, 37B. Once the S/H circuit settles, all of the input differential current flows only into the input/output terminals 38A, 38B of the amplifier 32, and the MOS capacitors 37A, 37B hold the differential input voltage that the amplifier 32 needs to sustain the current flow through its output terminals 38A, 38B. The settling response is in general second-order and greatly influenced by the value of capacitors 37A, 37B, the resistance of the switches used to close the loop around the amplifier, and the output parasitic capacitance 39A and 39B.

In this architecture the parasitic capacitance 39A, 39B associated with the input/output terminals 38A, 38B (ION, IOP) of the S/H cell can be made much smaller than in the prior art architecture that uses a switch matrix.

To end the sampling mode, the switches 34A, 34B, 36A and 36B are opened, and the S/H cell transitions into the hold mode for one additional clock phase to settle the differential output voltage at the terminals 38A and 38B of the S/H cell. During this hold mode, switches 44A, 44B are closed and 43A, 43B remain open. Resistance 46 and parasitic capacitances 39A, 39B cause the voltage to settle with first order response. The admittance of resistor 46 is designed to be ideally identical to the driving point admittance of resistance 42A, 42B, 42C, 42D so that ideally no transients occur during the next clock phase.

For the hold mode, when the MDAC is to be activated to multiply the current flow provided by the S/H cell, the switches 44A, 44B are opened and the switches 43A, 43B closed. The programmable impedances 42A–42D that form the weighting circuit to be connected to the S/H cell will have been set to their values and these values will determine the scaling to be given the differential current provided at terminal 38A, 38B. By keeping the admittance 46 equal to the driving point admittance of the weight circuit, the voltage across the parasitic capacitances 39A, 39B does not need to change when a weight circuit is connected or disconnected; hence transients are eliminated and the output sampling speed can be maximized. During the next ten clock pulses, the newly held current is connected through its weight circuit and summed with the other nine current samples already in the hold mode.

Figure 3:
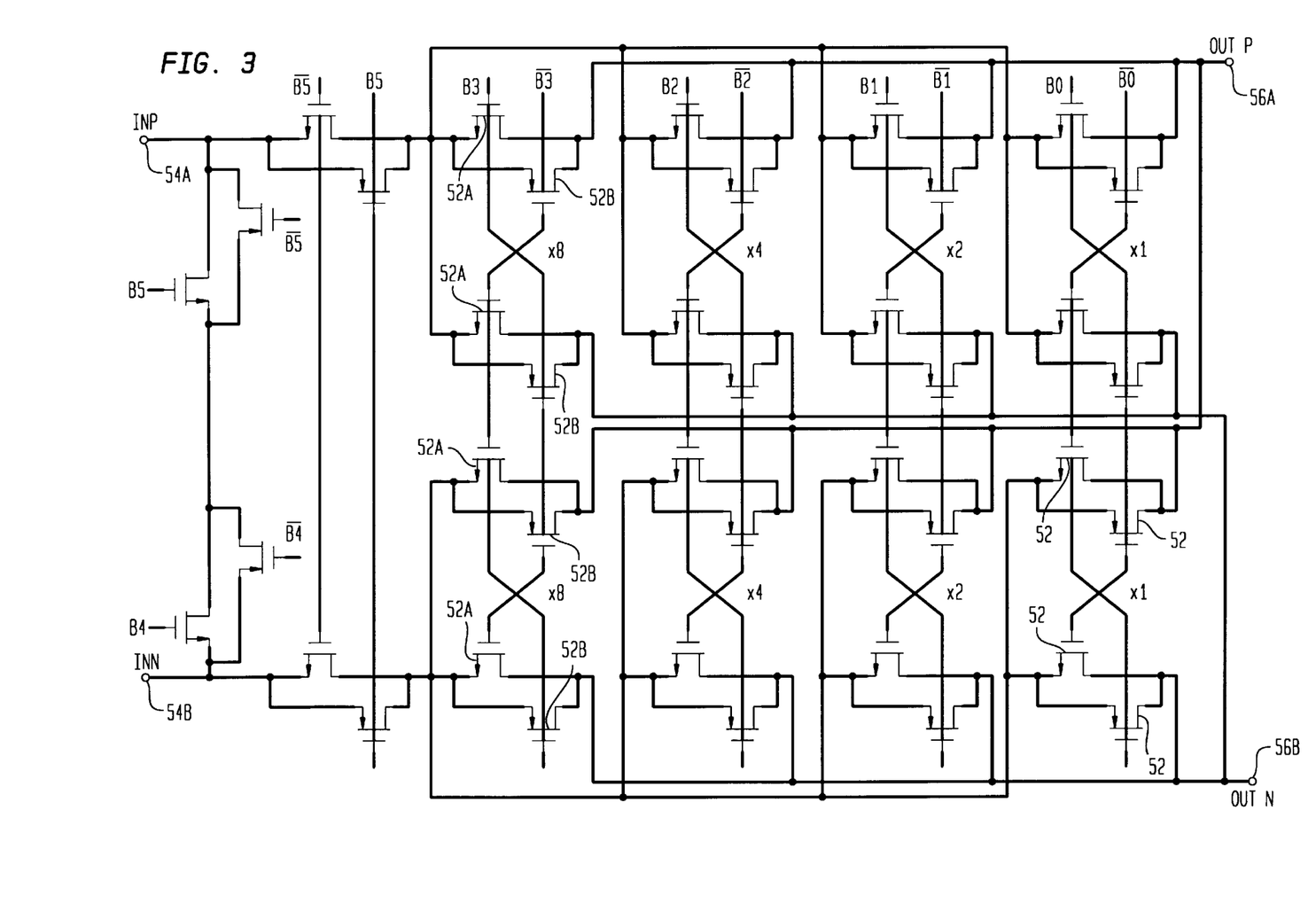
FIG. 3 is the circuit diagram of a binary-ratioed array of complementary transistor pairs useful as weighting circuits in the arrangement of FIG. 2.

FIG. 3 shows in more detail a preferred form of the programmable weight circuit 40 shown functionally in FIG. 2. Basically it comprises an array of 16 cross-coupled binary-ratioed n-channel transistors 52A and an array of 16 cross-coupled binary-ratioed p-channel transistors 52B to implement the coefficients defined by the four-bit weights that constitute the range of weights that are used for scaling. Additionally, the various N-MOS and P-MOS transistors shown with gate control signals B4, $\overline{B4}$, B5, $\overline{B5}$ serve to act as the various switches and resistor 46 shown in block 40 of FIG. 2. The transistors 52A, 52B operate in the triode region and, as is known, with the differential connection shown behave equivalently to linear resistors.

The value of the resistors represented by the various transistors is set by control of the channel conductance of each transistor and these are ratioed in the binary ratios of 1, 2, 4 and 8, as indicated. Of course, a wider range can be used, if desired, by adding additional bits. The relative conductance of the various transistors is controlled by the ratio of channel width-to-channel length in known fashion. The differential current from the balanced input/output terminals 38A, 38B of the switched current memory cell is applied to the two balanced input terminals 54A and 54B. The balanced current from the two output terminals 56A, 56B is supplied for summing to a low impedance path (relative to the driving point impedance of the tap weight) shared by all the active weights. This is provided by the balanced line 56A, 56B. The current from the input terminals 54 will be steered to the output terminals 56 via the straight-through and cross-coupled paths based on the relative resistance implemented by the cross-coupled transistors acting as resistors. This concept has been described in a paper by Z. Czarnul entitled "Modification of the Banu-Tsividis Continuous-Time Integrator Structure," IEEE Trans on Circuits and Systems, Vol. CAS-33 No. 7, pp. 714–716, published in July 1986 except that in the instant application the gate voltages applied to the MOSFETs for control are digital, as opposed to continuous tuning with analog levels. The balanced current at the output terminals 56A, 56B will vary essentially linearly from minus one to plus one times the input current applied to terminals 54A, 54B for the 16 control binary values 0000 to 1111. These are provided by the programmed controlled gate voltages B0–B3 and $\overline{B0}$–$\overline{B3}$ that serve to select the resistors appropriate to provide the desired weight.

The prior art form of a switched current memory cell generally of the kind depicted functionally in FIG. 2 was known to suffer from an error voltage that is injected into the storage capacitors when switches 36A, 36B are opened and creates an error in the held current.

Figure 4:
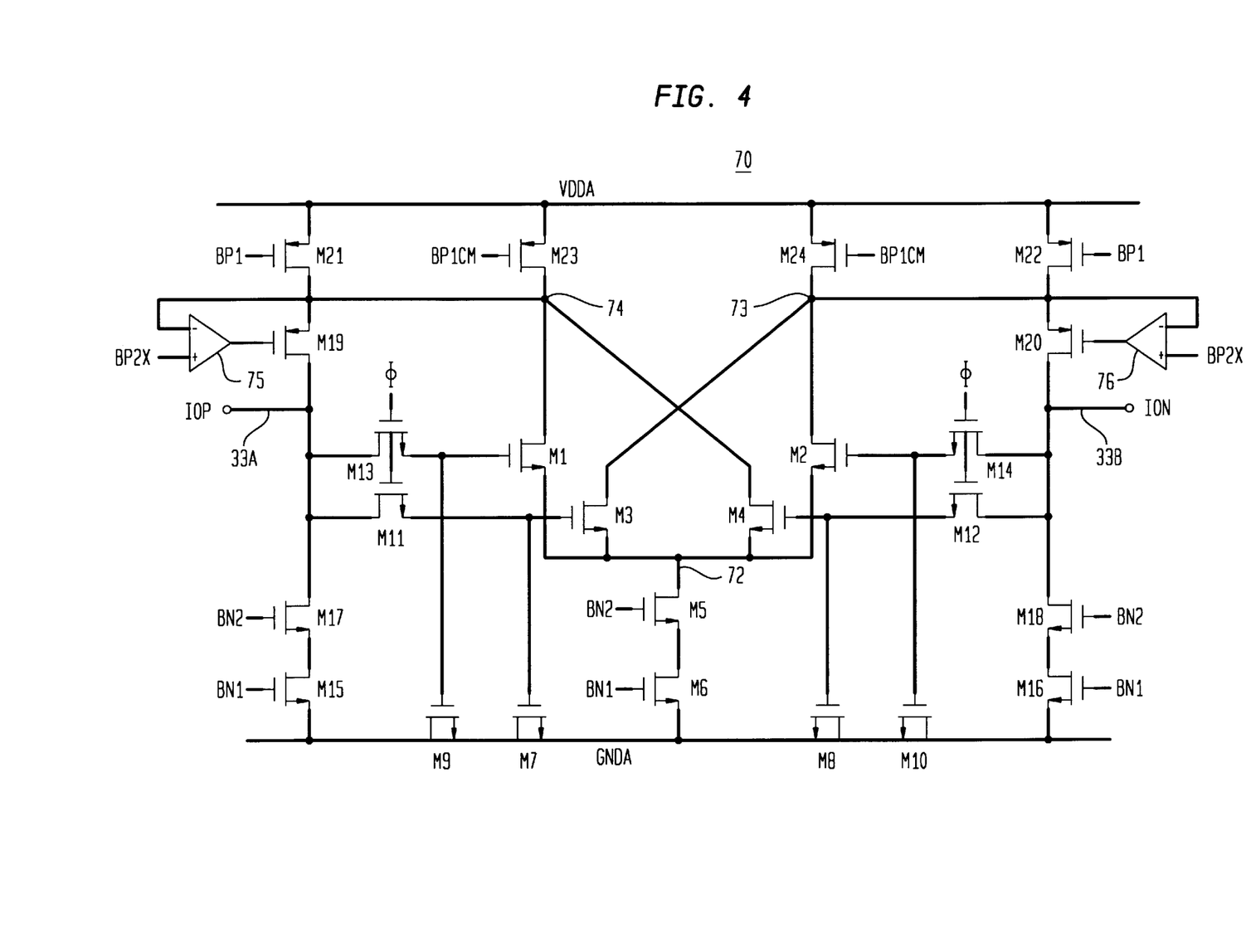
FIG. 4 is the circuit diagram of a preferred form of switched current memory cell for use as the S/H circuit in FIG. 2, that serves as a circuitry aspect of the invention.

The novel switched current memory cell 70 shown in FIG. 4 was developed to minimize this error. Basically the solution is to include a second differential transconductance amplifier and a second pair of storage capacitors in which there are developed error voltages that are used largely to cancel the error in the output (memorized) current. Cancellation of error currents is achieved by subtracting the output currents of the two differential transconductance amplifiers.

To this end, the cell 70 comprises the primary differential amplifier made up of N-MOS transistors M1 and M2 and the primary storage capacitors M9 and M10 that are formed by N-MOS transistors connected as capacitors in known fashion. Transistors M1 and M2 have their sources connected together at common node 72, which connects to GNDA by way of cascoded N-MOS transistors M5 and M6, whose gates are connected to d-c bias voltages BN1 and BN2 used to control the current flow to desired levels. In this and subsequent figures, d-c gate bias voltages used to control the current to a desired level will be designated variously as BN1, BN2, BP1, BP2, BP2X. The drains of M1 and M2 are connected to nodes 74 and 73. These in turn are connected to VDDA by way of the current balancing P-MOS transistors M23 and M24 whose gates are supplied by the output BP1CM of the common-mode feedback circuit (not shown here), to be described in connection with FIG. 5. The gates of M1 and M2 are connected by way of the N-MOS transistors M13 and M14 to the IOP and ION terminals that correspond to input/output terminals 38A, 38B of FIG. 2. M13 and M14 are switched open and closed by the clock pulse Φ, supplied by the clock generator and applied to their gates.

When the memory cell is in the sampling mode, Φ is high, turning on M13 and M14 and the balanced input current is applied at the IOP and ION terminals. The differential voltage on the gates of M1 and M2 needed to support the applied input current becomes stored on capacitors M9 and M10. When Φ goes low, the cell transitions into the hold mode; however, non-linearities that create error voltages occur due to the switch-charge injection of M13 and M14.

To reduce these effects, the cell 70 includes additional N-MOS transistors M3, M4, M11, and M12 and transistors M7 and M8 that act as capacitors. Transistors M3 and M4 are connected as a differential pair to form a secondary transconductance amplifier and their common source node 72 is also the common source node between M1 and M2. The drain of M3 shares node 73 with the drain of M2. The drain of M4 shares node 74 with the drain of M1. M11 is connected between the gate of M3 and the terminal IOP, and M12 is connected between the gate of M4 and the terminal ION. The clock Φ is applied to the gates of both M11 and M12. Capacitors M7 and M8 are connected between the gates of M3 and M4, respectively, and GNDA. Cascoded N-MOS transistor pairs M15, M17 and M16, M18 are connected between terminal IOP and GNDA and terminal ION and GNDA, respectively, and serve as high impedance output current sources. Similarly cascoded P-MOS transistor pairs M19, M21 and M20, M22 form cascode current sources between terminal IOP and VDDA and terminal ION and VDDA, respectively. Auxiliary amplifiers 75, 76 serve to increase the impedance of these cascode circuits using the known regulated cascode concept.

To cancel to the first order the charge injection effect of M13 and M14 that produces non-linearities, the charge injection is replicated with transistors M11 and M12 that form a secondary switch and capacitors M7 and M8 that form secondary storage capacitors, and this is subtracted from the stored signal with the secondary differential amplifier formed by transistors M3 and M4. The transconductance of each of transistors M3 and M4 is designed to be 10% of that of transistors M1 and M2 so the primary transconductance amplifier provided by M1 and M2 still has a large net transconductance. Transistors M11 and M12 and capacitors M7 and M8 are sized so that the charge injection is about ten times that of the main path.

Figure 5:
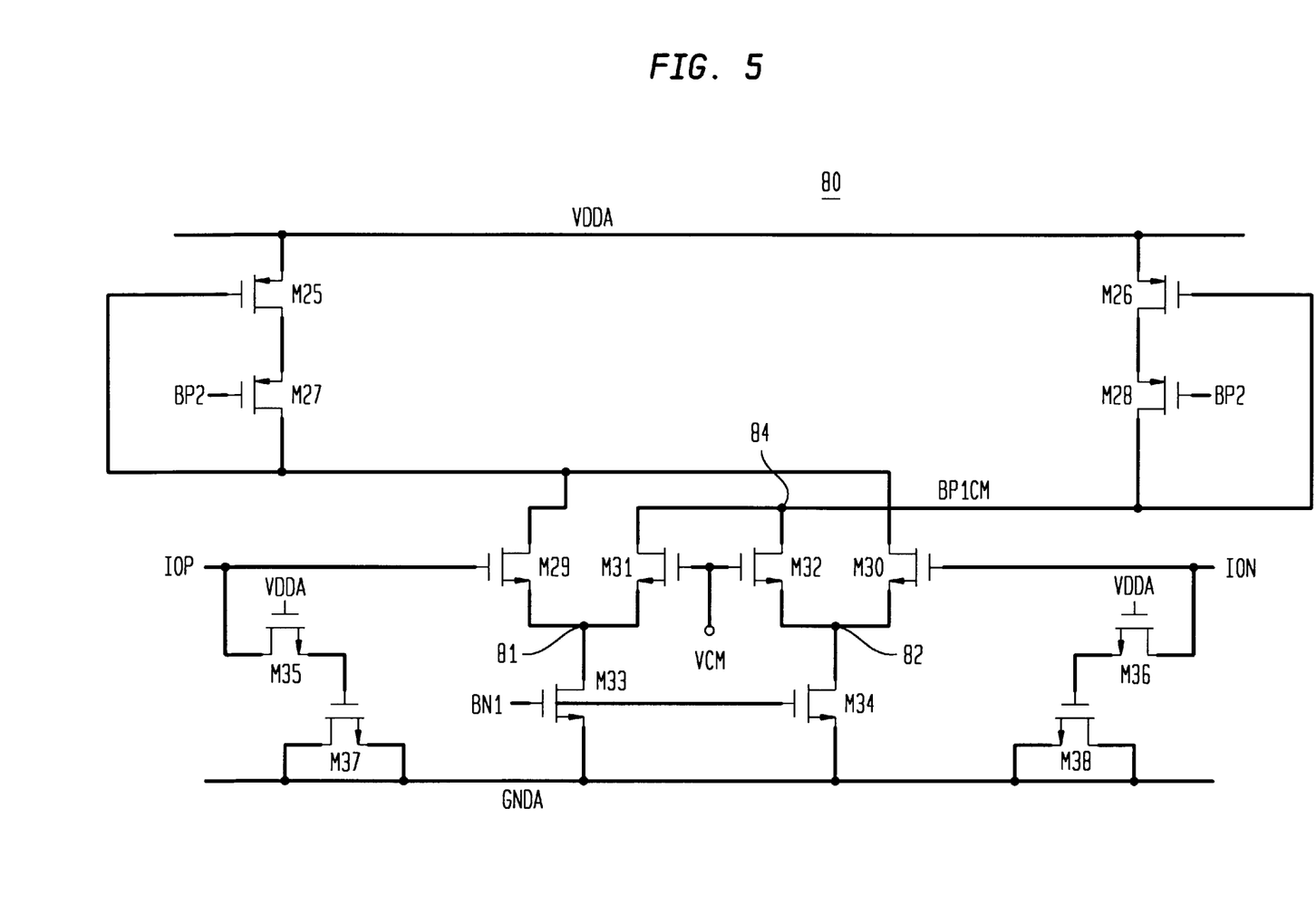
FIG. 5 is a circuit diagram of a common mode feedback circuit suitable for use in the switched current memory cell shown in FIG. 4 and the voltage-to-current converter shown in FIG. 6.

As is known, for proper biasing in differential amplifiers, it is important to insure that the two output voltages are balanced with respect to ground. To this end, it is common to employ common mode feedback (CMFB) circuitry. In FIG. 5, there is shown a preferred form of such a circuit 80 for such use in the S/H cell of FIG. 4. It includes two differential pairs of N-MOS transistors M29, M31 and M30, M32. The gates of M31 and M32 are both connected to the node VCM that is connected to a d-c source (not shown). The common mode feedback circuit operates to drive the common mode output voltage, $\frac{1}{2}(V_{IOP}+V_{ION})$, equal to the voltage level set at node $V_{CM}$.

The common node 81 of differential pair M29, M31 is connected to GNDA by way of N-MOS transistor M33 acting as a current source and the common node 82 of pair M30, M32 by way of current source N-MOS transistor M34. The terminals IOP and ION are connected to the gates of M29 and M30, respectively. It is usually advantageous to include N-channel transistors M35, M37 and M36, M38 between IOP and ION and ground, respectively, for frequency compensation of the CMFB loop. M37 and M38 act as capacitors to place the dominant pole while M35 and M36 operate as resistors to introduce phase lead to cancel partially the phase lag resulting from the nondominant poles.

During sampling, capacitors M7–M10 of the S/H cell 70 provide additional stabilization of the loop.

The drains of M29 and M30 are each connected to VDDA by way of N-channel transistors M25 and M27 that are connected in cascode.

The drains of M31 and M32 are connected to VDDA by way of P-MOS transistors M26 and M28, respectively. M26, M28 form a cascode current mirror, that mirrors the drain current of M31, M32 to M23, M24 in FIG. 4. A connection to the common node 84 between these drains serves as a source of the voltage BP1CM that is used in the switched current memory cell 70 shown in FIG. 4 to bias the gates of the p-channel transistors M23 and M24 that serve to adjust the output voltages on IOP and ION for balance about VCM.

Figure 6:
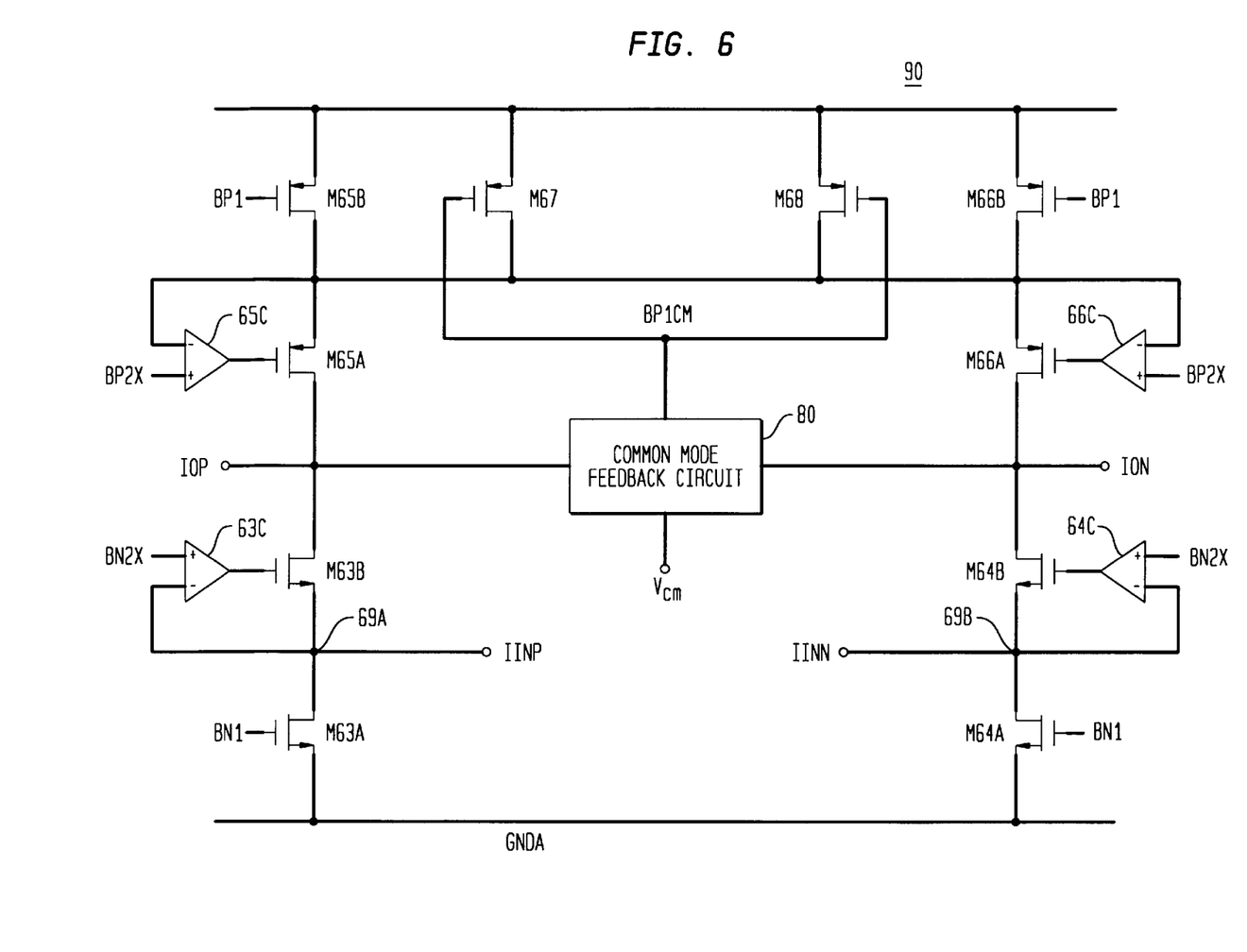
FIG. 6 shows one suitable form of voltage-to-current converter that can be used to convert input voltages to input currents for use in the switched current memory cell of FIG. 4.

Typically the signal to be filtered is available only from a balanced voltage input source whereas the filter of the invention requires a balanced current input signal. Accordingly, conversion of the input voltage signal to an input current signal is usually necessary for filtering in accordance with the invention. Various arrangements are known for such conversion. In FIG. 6, there is shown a preferred form of a circuit 90 for use with the invention for such a conversion. The circuit by itself is not a converter since it depends on an off-chip impedance to convert the voltage to a current; the circuit simply provides a low input impedance and a high output impedance.

The converter 90 includes a common mode feedback circuit 80, which may be of the kind previously described and to which are applied the differential input voltages at terminals IOP and ION, respectively, as of FIG. 5. These terminals are maintained between VDDA and GNDA by the two sets of cascoded pairs of N-MOS transistors M63A, M63B, M64A, M64B, and two sets of cascoded pairs of P-MOS transistors M65A, M65B and M66A, M66B and auxiliary feedback amplifiers 63C, 64C, 65C, 66C, that serve to provide high impedances. The control lead BP1CM from the CMFB circuit is provided to the gates of PMOS transistors M67 and M68 for control of the current being sourced from M67, M68 to control the common mode output voltage at terminals IOP, ION. The balanced input currents for application as current inputs to the switched current memory cells are available at terminals IOP and ION, during the sampling mode of the cells. Typically, off-chip resistors (not shown) are connected between terminals INP and INN and the voltage sources.

It is to be understood that the specific embodiment described is merely illustrative of the general principles of the invention and variations thereof may readily be devised by a worker in the art without departing from its basic spirit and scope.

For example, it should be feasible to substitute other forms of switched current memory cells, scaling circuits, common mode feedback circuits and voltage to current converters without departing from the principles of the invention. Additionally the number of taps included in the filter is a function of the transfer function it is to provide. It may also be desirable in some instances to allow more than the interval of one clock pulse for the settling or transition mode in which case there would be increased appropriately the number of S/H cells and weighting circuits needed for maintaining the same number of taps for the filter.

What is claimed is:

1. A filter circuit comprising:
   a voltage-to-current converter for receiving an input balanced voltage signal and providing an input balanced current signal;

a first plurality of means (each) for receiving the (an) input balanced current signals for sampling and holding successive sample balanced current values;

a second plurality of means for receiving and scaling the successive sampled balanced current values in accordance with a prescribed weighting program to achieve a desired transfer function for the filter, said scaling means including binary-ratioed impedance elements; and means for receiving the scaled balanced sampled current values (from said second means) and providing balanced output current values by summing at successive intervals different combinations of less than all of the scaled balanced sample current values (of the second plurality).

2. A filter circuit in accordance with claim 1 in which each of the first plurality of means is characterized by a sampling mode, a transition mode and a hold mode, the second plurality of means receives and scales only the value of samples currently in the hold mode, and the summing means sums only the values of the scaled samples currently in the hold mode for providing the output current values.

3. A filter in accordance with claim 2 in which each of the first plurality of means further comprises means for adjusting the balance sample current values for charge injection errors.

4. A filter in accordance with claim 3 in which the adjusting means comprises a positive feedback transconductance amplifier and a storage capacitor for replicating the charge injection errors for use in adjusting the balance sample current values.

5. A filter circuit comprising:

a voltage-to-current converter for receiving an input balanced voltage signal and providing an input balanced current signal;

a first plurality of sample and hold circuits for receiving the input balanced current signals and providing balanced current samples;

a second plurality of scaling circuits supplied with the balanced current samples for providing scaled balanced current samples in accordance with a prescribed weighting program to achieve a desired transfer function for the filter, said scaling circuits including binary-ratioed impedance elements; and a summning circuit supplied with the scaled balanced current samples for providing the filter output.

* * * * *

UNITED STATES PATENT AND TRADEMARK OFFICE
CERTIFICATE OF CORRECTION

PATENT NO. : 5,931,898
DATED : August 3, 1999
INVENTOR(S) : Khoury, John M.

It is certified that error appears in the above-identified patent and that said Letters Patent is hereby corrected as shown below:

On the Title page,
Please correct the omission of the Assignee, item [73]: Lucent Technologies, Murray Hill, New Jersey.

Signed and Sealed this

First Day of May, 2001

Attest:

NICHOLAS P. GODICI

Attesting Officer      *Acting Director of the United States Patent and Trademark Office*